US008817838B2

(12) United States Patent
Abe et al.

(10) Patent No.: US 8,817,838 B2
(45) Date of Patent: Aug. 26, 2014

(54) LASER DEVICE WITH OPTICAL ELEMENT MODULE ON SEPARATE PLATE

(75) Inventors: Tamotsu Abe, Kanagawa (JP); Hideo Hoshino, Kanagawa (JP)

(73) Assignee: Gigaphoton Inc., Tochigi-Ken (JP)

( * ) Notice: Subject to any disclaimer, the term of this patent is extended or adjusted under 35 U.S.C. 154(b) by 119 days.

(21) Appl. No.: 12/252,704

(22) Filed: Oct. 16, 2008

(65) Prior Publication Data

US 2009/0103575 A1 Apr. 23, 2009

(30) Foreign Application Priority Data

Oct. 17, 2007 (JP) ................. 2007-270209

(51) Int. Cl.
*H01S 3/03* (2006.01)
*H01L 23/02* (2006.01)
*H01S 3/22* (2006.01)

(52) U.S. Cl.
USPC ................. 372/55; 257/686; 372/61

(58) Field of Classification Search
USPC ...................... 372/55, 61; 257/686
See application file for complete search history.

(56) References Cited

U.S. PATENT DOCUMENTS

| | | | | |
|---|---|---|---|---|
| 3,921,098 A | * | 11/1975 | Hoag ................. | 372/58 |
| 4,757,511 A | * | 7/1988 | Klingel et al. ............. | 372/58 |
| 5,867,519 A | * | 2/1999 | Filgas ................ | 372/93 |
| 6,973,111 B2 | | 12/2005 | Yamashita et al. | |
| 2003/0142714 A1 | | 7/2003 | Yamashita et al. | |
| 2005/0002425 A1 | * | 1/2005 | Govorkov et al. ............. | 372/25 |

FOREIGN PATENT DOCUMENTS

| | | |
|---|---|---|
| JP | 2002-252401 A | 9/2002 |
| JP | 2003-224317 A | 8/2003 |
| JP | 2005-525001 A | 8/2005 |
| JP | 2006-024596 A | 1/2006 |
| JP | 2007-049090 A | 2/2007 |
| WO | 03/100826 A2 | 12/2003 |

OTHER PUBLICATIONS

Japanese Notice of Reason for Rejection, w/ English translation thereof, issued in Japanese Patent Application No. JP 2007-270209 dated Dec. 11, 2012.
Japanese Notice of Reason for Rejection, w/ English translation thereof, issued in Japanese Patent Application No. JP 2007-270209 dated May 9, 2013.

* cited by examiner

*Primary Examiner* — Tod T Van Roy
*Assistant Examiner* — Marcia Golub-Miller
(74) *Attorney, Agent, or Firm* — McDermott Will & Emery LLP

(57) ABSTRACT

A laser device, which includes an oscillator unit having a rectangular-solid-shaped housing containing a laser oscillator for generating and outputting a laser light; an amplifier unit having a rectangular-solid-shaped housing containing an amplifier that receives and amplifies the laser light to output; and, a group of optical elements including optical elements provided on a laser light path, wherein the laser device includes one or more amplifier units, and the oscillator and the amplifier units are arranged such that surfaces having a wide area other than a surface having a smallest area of a housing of the oscillator unit and a housing of at least one amplifier unit are next to and face each other, or such that surfaces having a wide area other than a surface having a smallest area of a housing of at least two amplifier units are next to and face each other.

11 Claims, 12 Drawing Sheets

FIRST EXAMPLE

THIRD EXAMPLE

AT THE TIME OF BEING INSTALLED

DURING MAINTENANCE

FIFTH EXAMPLE

SIXTH EXAMPLE

LASER DEVICE WITH OPTICAL ELEMENT MODULE ON SEPARATE PLATE

BACKGROUND

1. Technical Field

The present invention relates to a laser device, more specifically to a laser device used for a driver of an EUV light source.

2. Related Art

To achieve higher density LSI, the photolithography technology, in which a circuit pattern is optically transferred on a semiconductor wafer, plays an important role. In the photolithography process, a reduced-projection-exposure device, called a stepper, is mainly employed. In other words, with the reduced projection light system, a transmitted light having an original pattern (reticle) emitted by a light source is projected to a light-sensitive material on a semiconductor substrate, and the circuit pattern is formed. The resolution of this projected image depends on the wavelengths of the light source used. Thus, with the increasing demand for finer pattern line width, the wavelength of the light source is shortened to an ultraviolet range.

Recently, as light sources, KrF excimer laser (wavelength of 248 nm) and ArF excimer laser (wavelength of 193 nm) that generate light at a range of deep ultraviolet (DUV light) have been employed. Furthermore, $F_2$ laser (wavelength of 157 nm) that generates light at a range of vacuum ultraviolet (VUV light) is developed as the light source.

These days, for the purpose of finer machining, EUV light sources (wavelength of 13.5 nm) that output the light at a range of extreme ultraviolet (hereinafter, "EUV light") have been tried as the light source for the photolithography.

In general, an LPP (laser produced plasma) type and a DPP (discharge produced plasma) type are used to generate the EUV light. In the LPP-type EUV light source, the short-pulse laser light generated and emitted by a driver laser device is projected onto a target formed by tin Sn; the target is excited to be a plasma state to generate the EUV light; and the EUV light is collected by a collection lens to output the EUV light to the outside.

As the driver laser device, a $CO_2$ laser and so on are employed.

Currently, the EUV light having output of 140 W is required for the light source of the exposure device. However, in the LPP-type EUV light source system that employs $CO_2$ laser as the driver laser device and uses a target formed of tin Sn, only about 1-2% of output can be obtained as the EUV light output from the laser light emitted by the driver laser device. Thus, to obtain the output of 140 W of the EUV light required, it becomes necessary to use a driver laser device capable of outputting laser of 10 kW.

Incidentally, the industrial $CO_2$ laser having the output of 20 kW is commercially available. However, this industrial $CO_2$ laser is not the pulse oscillating laser device necessary for the driver laser device for the EUV light source, but is a CW oscillating laser device. To utilize as the driver laser device for the EUV light source, the short pulse oscillation of about 10-100 ns is necessary for the $CO_2$ laser. However, there is no commercially available $CO_2$ laser that can output the 10 kW laser with such short pulse oscillation. Thus, there has been conventionally provided a driver laser device having a configuration in which the short pulse oscillation $CO_2$ laser having small output of about 50-100 W is used as the oscillator, and plural amplification stage lasers (amplifiers) are provided at the rear stage of the oscillator.

To obtain the laser output of 10 kW with the driver laser device, about four stages of the amplification stage lasers (amplifier) are required when the oscillator having the output of 50-100 W is employed. Here, the oscillator has a rectangular-solid-shaped housing (hereinafter, "oscillator unit"). Additionally, the amplification stage laser (amplifier) has a rectangular-solid-shaped housing (hereinafter, "amplifier unit"). Thus, those oscillator unit and four amplifier units occupy a large floor space in the semiconductor manufacturing lines. Furthermore, in addition to the oscillator and the amplifier units, the driver laser device is necessary to be equipped with a group of optical elements comprising each optical element for shaping and transferring the laser light in the optical path among the oscillator and the amplifier units. Moreover, a power supply is necessary separately for the oscillator and the amplifier units.

FIG. 1 shows an example of a configuration in which an oscillator unit 11, four amplifier units 21, 22, 23, 24, a group of optical elements 31 (31A, 31B, 31C, 31D), and power supplies 41, 42, 43, 44, 45 respectively for the oscillator unit 11, the amplifier units 21, 22, 23, 24 are arranged on a floor space in the semiconductor manufacturing line.

As shown in FIG. 1, the oscillator unit 11 and the four amplifier units 21, 22, 23, 24 are arranged such that a surface 11A having a wide area of the housing of the oscillator unit 11, and surfaces 21A, 22A, 23A, 24A each having a wide area of the housing of each of the four amplifier units 21, 22, 23, 24 are in parallel with the floor surface. Additionally, the group of optical elements 31 (31A, 31B, 31C, 31D) and the power supplies 41, 42, 43, 44, 45 are arranged accordingly. Thus, the footprint (occupied space) FP further exceeds 100 $m^2$, and becomes extremely large. It would be acceptable if the purpose is to implement experiments or researches. However, it is practically difficult to reserve a vast area in the floor space in the semiconductor manufacturing line only for the EUV light source, or only for the driver laser device.

The present invention has been made in view of the circumstances above and the first problem to be solved by the present invention is to reduce a footprint in arranging a laser device on a floor space in the semiconductor manufacturing line, etc, even if the laser device comprises a number of amplifier units.

As described above, since the oscillator unit 11 and the four amplifier units 21, 22, 23, 24 are arranged such that the surface 11A having a wide area of the housing of the oscillator unit 11, and surfaces 21A, 22A, 23A, 24A each having a wide area of the housing of each of the four amplifier units 21, 22, 23, 24 are in parallel with floor surface, a total optical path LR passing through the units 11, 21, 22, 23, 24 reaches as long as 40-50 m. Therefore, the whole of the group of optical elements 31 cannot be mounted on the same plate, and hence each of the optical elements 31A, 31B, 31C, 31D has to be arranged in a decentralized manner on vibration isolators 51, 52, 53, 54 separately arranged in given places. This causes a problem that operator bears a large burden because the operator has to walk around each of the separated places to perform adjustment of the alignment of the optical elements, or other maintenance operations, which deteriorates the operating efficiency. Furthermore, due to the increased optical path and decentralized arrangement of the group of optical elements, the alignment of the optical system is largely affected by the stability of the floor surface and vibration of the floor or slight shock during the maintenance. For example, in a case where the optical path reaches 40-50 m, the slight displacement of only 100 μm in the transmission optical system results in the displacement of several mm at around the portion where the laser light is outputted, which hinders the efficient amplification and deteriorates the laser output. This poses a problem that it becomes difficult to guarantee the long-term stability of the laser output in a circumstance where this guarantee is required, such as the semiconductor manufacturing line.

The present invention has been made in view of the above circumstances and the second problem to be solved by the invention is to decrease the burden of the operator by shortening the optical path and centralizedly arranging the group of optical elements into one place to enhance the work efficiency during the maintenance of the group of optical elements, and to stabilize the laser output in a long term by making the group of optical elements less likely to be affected by the vibration and so on.

SUMMARY

A first aspect of the present invention provides a laser device comprising an oscillator unit having a rectangular-solid-shaped housing containing a laser oscillator for generating and outputting a laser light; an amplifier unit having a rectangular-solid-shaped housing containing an amplifier that receives and amplifies the laser light to output; and, a group of optical elements including a plurality of optical elements provided on an optical path of the laser light output from the oscillator unit, and the laser lights input into and output from the amplifier unit, wherein the laser device includes one or more amplifier units, and the oscillator unit and the amplifier unit are arranged such that surfaces having a wide area other than a surface having a smallest area of a housing of the oscillator unit and a housing of at least one amplifier unit are next to and face each other, or such that each surface having a wide area other than a smallest area of a housing of at least two amplifier unit are next to and face each other.

A second aspect of the present invention provides a laser device comprising an oscillator unit having a rectangular-solid-shaped housing containing a laser oscillator for generating and outputting a laser light; an amplifier unit having a rectangular-solid-shaped housing containing an amplifier that receives and amplifies the laser light to output; and, a group of optical elements including a plurality of optical elements provided on an optical path of the laser light output from the oscillator unit, and the laser lights input into and output from the amplifier unit, wherein the laser device includes one or more amplifier units, the group of optical elements are disposed on a plate, and the oscillator unit, the amplifier unit, and the plate are arranged such that the light output from the oscillator unit and the lights input into and output from at least one amplifier unit intersect with the plate, or such that the lights input into and output from at least two amplifier units intersect with the plate.

A third aspect of the present invention provides a laser device A laser device comprising an oscillator unit having a rectangular-solid-shaped housing containing a laser oscillator for generating and outputting a laser light; an amplifier unit having a rectangular-solid-shaped housing containing an amplifier that receives and amplifies the laser light to output; and, a group of optical elements including a plurality of optical elements provided on an optical path of the laser light output from the oscillator unit, and the laser lights input into and output from the amplifier unit, wherein the group of optical elements is arranged on the plate formed with one-piece member to form an optical element module.

A fourth aspect of the present invention provides a laser device according to the first or second aspect of the present invention, wherein the group of optical elements is arranged on a plate formed with one-piece member to form an optical element module.

A fifth aspect of the present invention provides a laser device according to the third aspect of the present invention, wherein the group of optical elements is disposed on a same surface of the plate.

A sixth aspect of the present invention provides a laser device according to the fourth aspect of the present invention, wherein the group of optical elements is disposed on a same surface of the plate.

A seventh aspect of the present invention provides a laser device according to the third aspect of the present invention, wherein the optical element module comprises a cover that covers the plate and the group of optical elements.

An eighth aspect of the present invention provides a laser device according to the fourth aspect of the present invention, wherein the optical element module comprises a cover that covers the plate and the group of optical elements.

A ninth aspect of the present invention provides a laser device according to the third aspect of the present invention, wherein the cover of the optical element module is provided with any of or both or a purge gas inlet for introducing a purge gas, and a hatch for maintenance.

A tenth aspect of the present invention provides a laser device according to the fourth aspect of the present invention, wherein the cover of the optical element module is provided with any of or both or a purge gas inlet for introducing a purge gas, and a hatch for maintenance.

An eleventh aspect of the present invention provides a laser device according to the first aspect of the present invention, wherein the housings of the oscillator unit and the at least one amplifier unit, each of which is next to each other and whose wide surfaces face to each other, or the housings of at least two amplifier units, each of which is next to each other and whose wide surfaces face to each other, are vertically layered.

A twelfth aspect of the present invention provides a laser device according to the second aspect of the present invention, wherein the housings of the oscillator unit and the at least one amplifier unit, or the housings of the at least two amplifier units are placed below the plate.

As shown in FIG. 6, a laser device 1 according to the first aspect of the present invention comprises an oscillator unit 11 has a rectangular-solid-shaped housing, amplifier units 21, 22, 23, 24 each have a rectangular-solid-shaped housing, laser light L output from the oscillator 11, and a group of optical elements 31 including plural optical elements 31a, 31b, 31c, . . . provided in an optical path LR of the laser light L inputted into the amplifier units 21, 22, 23, 24 and of the laser light L output from the amplifier units 21, 22, 23, 24. As shown in FIG. 4A, the oscillator unit 11 incorporates a laser oscillator 60 that generates and outputs the laser light L. Additionally, as shown in FIG. 4B, each of the amplifier units 21, 22, 23, 24 incorporates an amplifier 70 that amplifies incoming laser light L to output the amplified laser light L.

Here, it may be possible to provide only one amplifier unit, or to provide plural amplifier units.

As shown in FIG. 6, the oscillator unit 11 and the amplifier units 21, 22 are arranged such that each surface 11A, 21A, 22A having a wide area other than a surface having the smallest area of the housing of each of the oscillator unit 11 and at least one amplifier unit 21, 22 (two amplifier units in FIG. 6) is next to each other and faces each other. Additionally, at least two amplifiers 23, 24 are arranged such that each surface 23A, 24A having a wide area other than a surface having the smallest area of the housing of each of the amplifiers 23, 24 is next to each other and faces each other.

Therefore, as shown in FIG. 3, the footprint (occupied space) FP can be greatly reduced as compared with conventional arts (FIG. 1), because the oscillator unit 11 and the amplifier units 21, 22 are arranged such that each of the surfaces 11A, 21A, 22A having a wide area other than a surface having the smallest area of the housing of each of the oscillator unit 11 and the at least one amplifier unit 21, 22 (two amplifier units in FIG. 6) is next to each other and faces each other while at least two amplifiers 23, 24 are arranged such that each of the surfaces 23A, 24A having a wide area other than a surface having the smallest area of the housing of each of the amplifiers 23, 24 is next to each other and faces each other. As described above, according to the present invention, even if the laser device 1 is configured to have a number of amplifier units 21, 22, 23, 24, the footprint FP necessary for installing the laser device 1 on the floor in the semiconductor manufacturing lines and so on can be reduced.

According to the second aspect of the present invention, as shown in FIGS. 2 and 6, the group of optical elements 31 is arranged on a plate 32. And, the oscillator unit 11, the amplifier unit (amplifier unit 21 in FIG. 2, amplifier units 21, 22, 23, 24 in FIG. 6), and the plate 32 are arranged such that the output light output from the oscillator unit 11, the incoming light input to and the outgoing light output from the at least one amplifier unit (amplifier unit 21 in FIG. 2, amplifier units 21, 22, 23, 24 in FIG. 6) intersect with the plate 32. Alternatively, as shown in FIG. 6, the amplifier units 21, 22, 23, 24, and the plate 21 are arranged such that each of the incoming light input to and the outgoing light output from each of the at least two amplifier units 21, 22, 23, 24 intersects with the plate 32.

In FIG. 6, for example, the group of optical elements 31 is arranged on the plate 32. And, the oscillator unit 11, the amplifier units 21, 22, 23, 24, and the plate 32 are arranged such that the output light output from the oscillator unit 11, the incoming light input to and the outgoing light output from the at least one amplifier units 21, 22, 23, 24 intersect with the plate 32. Thus, as shown in FIG. 3, the area covered by the oscillator 11, the amplifier units 21, 22, 23, 24, and the group of optical elements 31 can be reduced as compared with the conventional art (FIG. 1), whereby the footprint (occupied area) FP can be greatly reduced as compared with the conventional art (FIG. 1).

As described above, according to the present invention, even if the laser device 1 is configured to have a number of amplifier units 21, 22, 23, 24, the footprint FP necessary for installing the laser device 1 on the floor in the semiconductor manufacturing lines and so on can be reduced.

According to the third aspect of the present invention, as shown in FIGS. 2 and 6, an optical element module 30 has a configuration in which the group of optical elements 31 is arranged on the plate 32 that is formed with one-piece member. Thus, the length of the optical path LR becomes shorter than the conventional art (FIG. 1), and the group of optical elements 31 can be centralizedly arranged in one place on the plate 32. This enables the increase in the work efficiency during the maintenance of the group of optical elements 31, which leads to the decrease in operator's burden. Additionally, because of the shortened optical path LR, the group of optical elements is less likely to be affected by the vibration and so on. This enables the laser output to be stabilized in a long term.

The fourth aspect of the present invention provides the configuration similar to the third aspect of the present invention in addition to the configuration of the first or the second aspect of the present invention, whereby the operation and effect achieved by the third aspect of the present invention can be obtained in addition to the operation and effect achieved by the first or the second aspect of the present invention.

According to the fifth and the sixth aspects of the present invention, as shown in FIGS. 2 and 6, the group of optical elements 31 is arranged on the same surface 32A of the plate 32. Thus, the operator can intensively perform the maintenance operations of the group of optical elements 31 on the same surface 32A of the plate 32. This enables a further improvement in the operability during the maintenance, and a further reduction in operator's burden.

According to the seventh and the eighth aspects of the present invention, as shown in FIG. 7, the optical element module 30 comprises a cover 33 that covers the plate 32 and the group of optical elements 31.

According to the ninth and the tenth aspects of the present invention, as shown in FIG. 7, the cover 33 of the optical element module 30 is provided with any of or all of a purge gas inlet 34 from which a purge gas is introduced, and maintenance hatches 35, 36, 37.

If the optical path LR of the high output $CO_2$ laser is exposed to the atmospheric air, the laser light is absorbed by the atmospheric air. This causes the disturbance effect of the laser light, which may poses instability of the laser output. According to the aspect of the present invention, a purge gas (e.g. N2 gas) is introduced into the cover 33 from the purge gas inlet 34 of the cover 33 of the optical element module 30, and the atmospheric air within the cover 33 is purged with the purge gas, whereby the optical path LR of the high output $CO_2$ laser is prevented from being exposed to the atmospheric air. This makes it possible to minimize the disturbance effect of the laser light, and stabilize the laser output. Additionally, if the group of optical elements 31 is exposed to the atmospheric air during the maintenance, the dust is more likely to be attached to the optical elements 31a, 31b, . . . . If the dust is attached to the optical elements 31a, 31b . . . , the dust absorbs the laser light, and hence the optical elements 31a, 31b, . . . may be heated to be damaged. According to the aspect of the present invention, the maintenance of the group of optical elements 31 is performed through the maintenance hatches 35, 36, 37 locally provided to the cover 32. This enables minimizing the possibility that the dust is attached to the group of optical elements 31 due to the exposure to the atmospheric air.

According to the eleventh aspect of the present invention, as shown in FIG. 6, the housing of the oscillator unit 11 and the housing of the at least one amplifier unit 21, 22, which are made adjoin to each other and whose wide surfaces are made face to each other, are vertically layered. Additionally, the housings of the at least two amplifier units 23, 24, which are made adjoin to each other and whose wide surfaces are made face to each other, are vertically layered. Thus, as shown in FIG. 3, although the area covered by the oscillator unit 11 and the amplifier units 21, 22, 23, 24 is expanded in the vertical direction, the expansion in the horizontal direction can be reduced as compared with the conventional art (FIG. 1), whereby the footprint (occupied area) FP can be greatly reduced as compared with the conventional art (FIG. 1).

According to the twelfth aspect of the present invention, as shown in FIG. 2, the housing of the oscillator unit 11, and each housing of the at least one amplifier unit 21 are placed below the plate 32. Thus, the area covered by the oscillator unit 11 and the amplifier 21 is confined within the floor area covered by the plate 32, whereby the footprint (occupied area) FP can be greatly reduced as compared with the conventional art (FIG. 1).

BRIEF DESCRIPTION OF THE DRAWINGS

FIG. 8A is a diagram illustrating a maintenance mechanism as viewed from a side of the optical elements module, FIG. 8B is a diagram illustrating the maintenance mechanism as viewed from a rear side, showing a state where the oscillator unit and the amplifier unit are fixedly installed to a frame, and FIG. 8C is a diagram illustrating the maintenance mechanism as viewed from the optical element module, showing a state where the oscillator unit and the amplifier unit can be drawn from the frame;

FIG. 11A is a top view of the laser device, and FIG. 11B is a perspective view illustrating the laser device as viewed from the front surface side of the laser device; and, FIGS. 12A and 12B are configuration diagrams of the laser device of a sixth example.

DETAILED DESCRIPTION

Hereinafter, exemplary embodiments of a laser device according to the present invention will be described with reference to drawings. Note that a driver laser device ($CO_2$ laser) of an EUV light source is assumed in the examples below.

First Example

Figure 1:
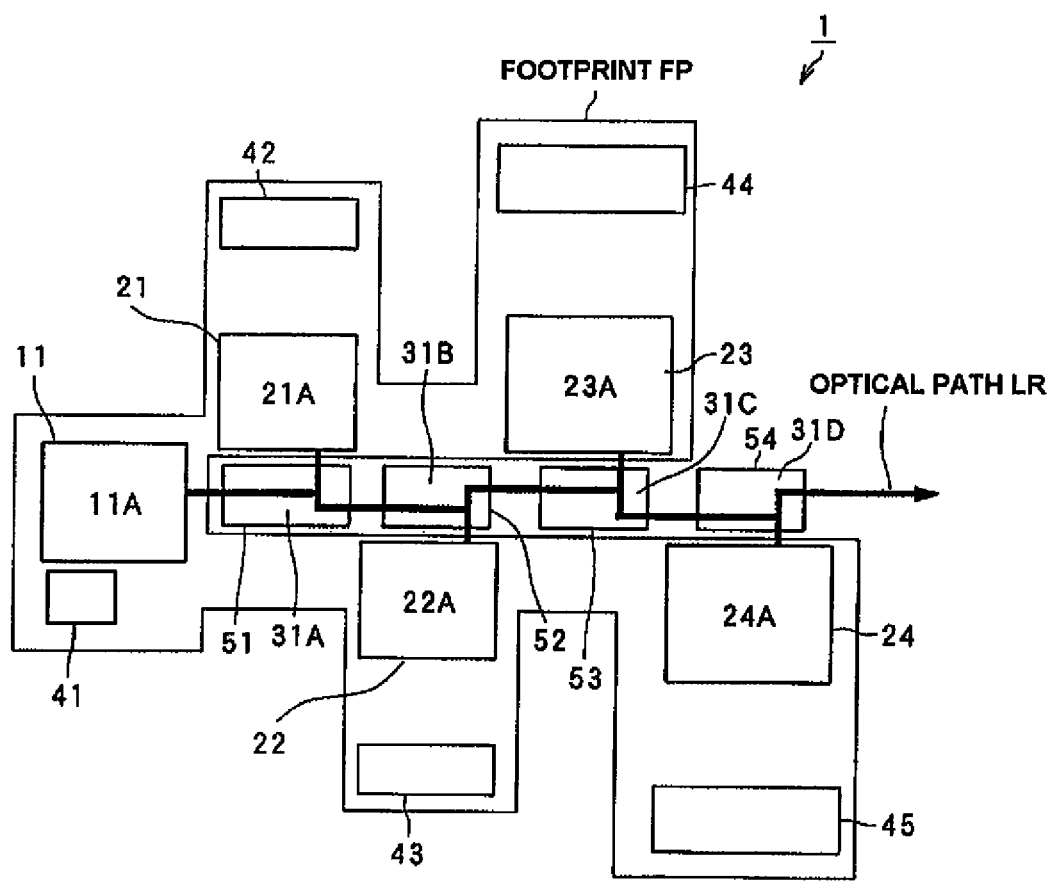
FIG. 1 is a top view of a laser device for explaining a conventional art.
Figure 3:
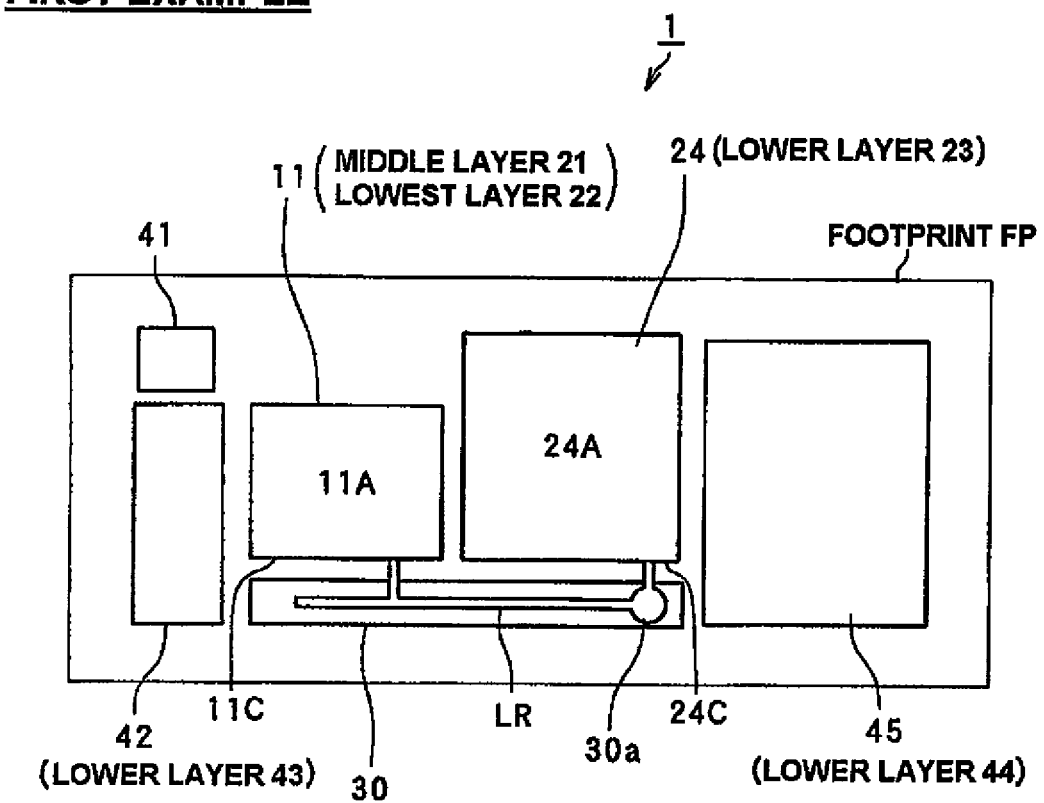
FIG. 3 is a top view of a laser device of a first example.
Figure 4A:
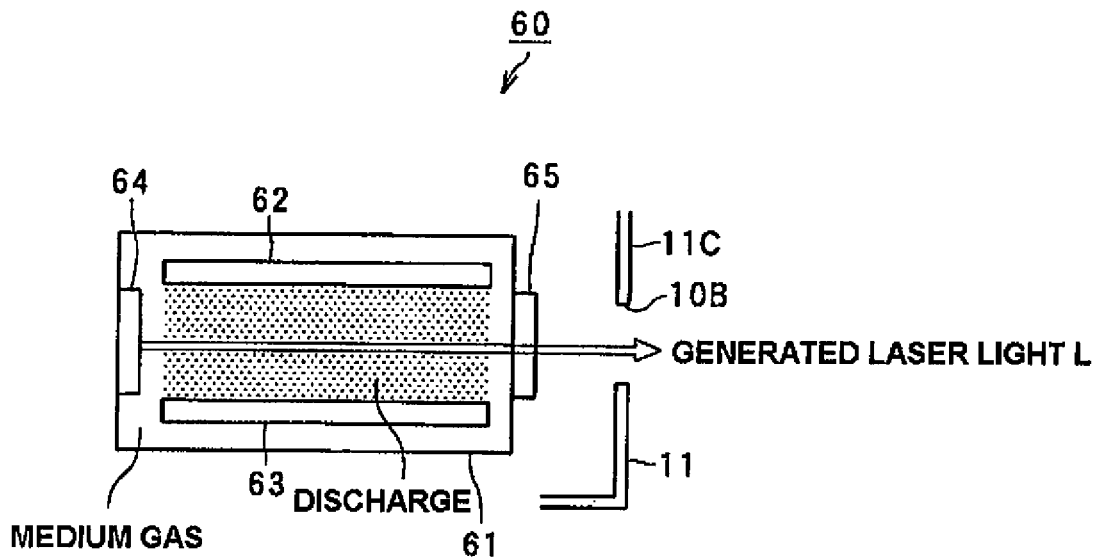
FIGS. 4A and 4B are diagrams showing examples of inner configuration of an oscillator unit and an amplifier unit of the first example, respectively.
Figure 4B:
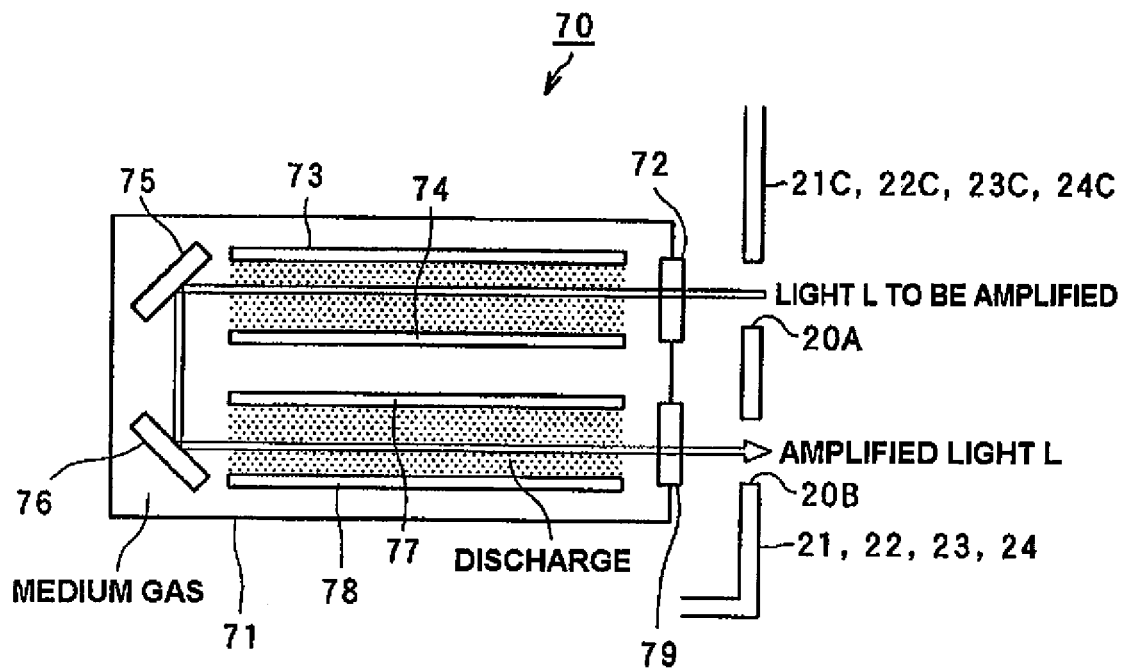
Figure 6:
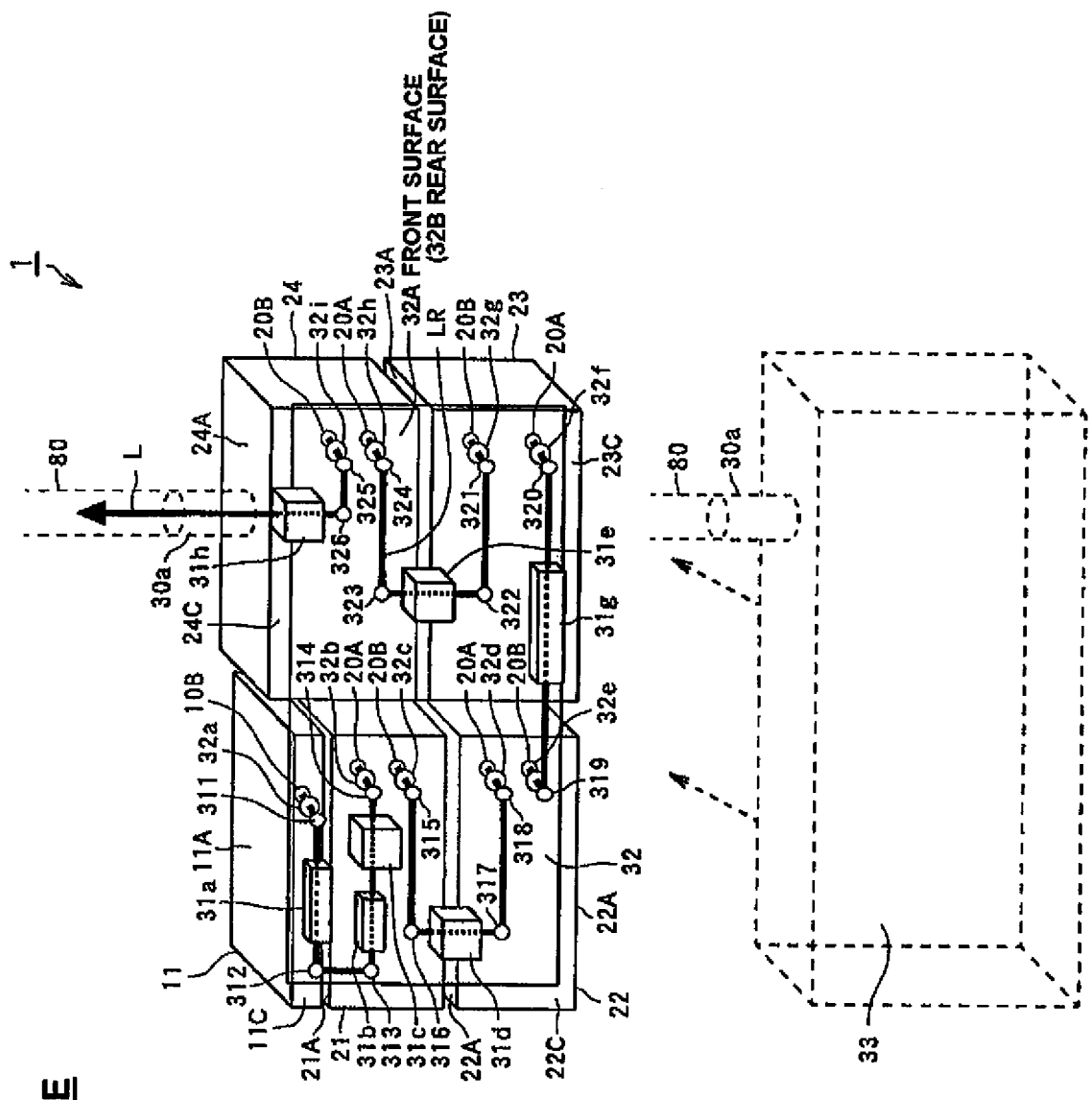
FIG. 6 is a perspective diagram illustrating the laser device of the first example as viewed from a front surface side.
Figure 7:
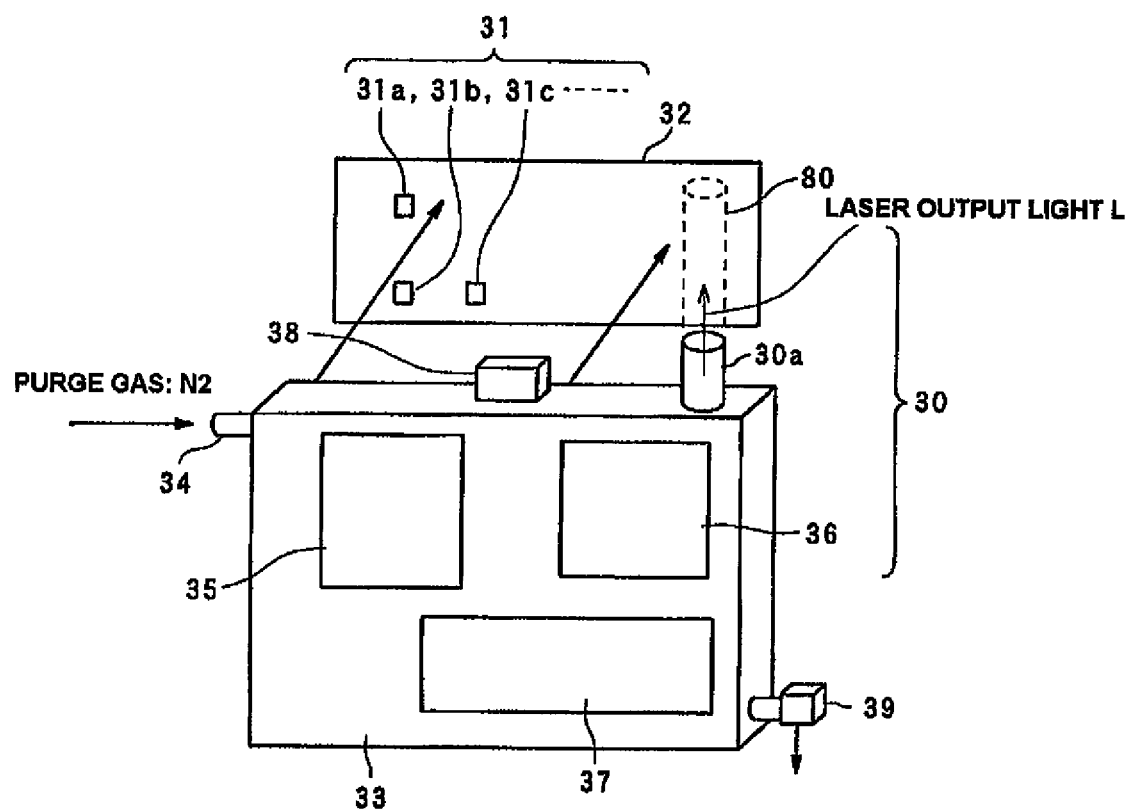
FIG. 7 is a perspective diagram showing an external appearance of an optical element module of the laser device of the first example.

FIG. 3 is a configuration diagram of the laser device 1 of the first example, and shows a top view, as is the case with FIG. 1 that illustrates a conventional art. FIGS. 4A and 4B are diagrams showing examples of inner configurations of the oscillator unit 11 and the amplifier units 21, 22, 23, 24 of the first example, respectively. FIGS. 51A and 51B are diagrams showing other examples of inner configurations of the amplifier units 21, 22, 23, 24 of the first example, respectively. FIG. 6 is a perspective view illustrating the laser device 1 of the first example as viewed from the front surface side. FIG. 7 is a perspective view illustrating an external appearance of the optical element module 30 of the laser device 1 of the first example.

As shown in FIGS. 3 and 6, the laser device 1 of the first example comprises one oscillator unit 11, four amplifier units 21, 22, 23, 24, a group of optical elements 31, power supplies 41, 42, 43, 44, 45 respectively for the oscillator unit 11, and the amplifier units 21, 22, 23, 24 as is the case with the conventional laser device 1 (FIG. 1), and is installed on a floor space in the semiconductor manufacturing line. By sharing interlock circuit or other items as much as possible, the size of the power supplies 41, 42, 43, 44, 45 are made small.

Each of the oscillator unit 11 and the amplifier units 21, 22, 23, 24 has a rectangular-solid-shaped housing.

As shown in FIG. 4A, the oscillator 11 incorporates a laser oscillator 60 that generates and outputs the laser light L. The laser oscillator 60 emits the generated light in only one direction, and the laser light L is emitted to the outside from an output port 10B provided to a surface 11C of the housing of the oscillator unit 11.

In other words, the laser oscillator 60 comprises: a tube (chamber) 61 within which a medium gas is enclosed; a pair of electrodes 62, 63 provided in the tube 61, in which discharge is made occur across the electrodes; a mirror 64 that reflects the light generated by the discharge in the tube 61 to the side of the output port 10B; and, a partial mirror 65 that is provided on the output port side of the tube 61 and passes part of the light generated in the tube 61. In FIG. 4A, although the oscillator unit 11 is formed by a single laser oscillator, the oscillator unit may have a configuration in which an oscillator is combined with plural modulation units or amplifiers.

As shown in FIG. 4B, each of the amplifier units 21, 22, 23, 24 incorporates an amplifier 70 that receives the laser light L, amplifies the received laser light L, and outputs the amplified laser light L. The amplifier units 21, 22, 23, 24 each have a configuration in which the light is input from an input port 20A or output through an output port 20B, the ports being provided to a same surface 21C, 22C, 23C, 24C of each housing. In this case, the amplifier 70 is configured such that the incoming light input from the input port 20A and the outgoing light output through the output port 20B are substantially in parallel while the incoming light and the outgoing light pass through the same plane.

In other words, the amplifier 70 comprises: a tube (chamber) 71 within which a medium gas is enclosed; a window 72 that is provided to the tube 71, passes a light input from the input port 20A to be amplified, and guides the input light between a pair of electrodes 73, 74; the pair of electrodes 73, 74 provided in the tube 71, in which discharge is made occur across the electrodes; a mirror 75 that is provided in the tube 71 and reflects the light generated by the discharge across the pair of electrodes 73, 74 to guide the light to a mirror 76; the mirror 76 that is provided in the tube 71 and reflects the light to guide to a pair of electrodes 77, 78; the pair of electrodes 77, 78 provided in the tube 71, in which discharge is made occur across the electrodes; and, a window 79 that is provided to the tube 71 and passes the light generated through the pair of electrodes 77, 78 as the amplified light to output the same through the output port 20B.

Figure 5A:
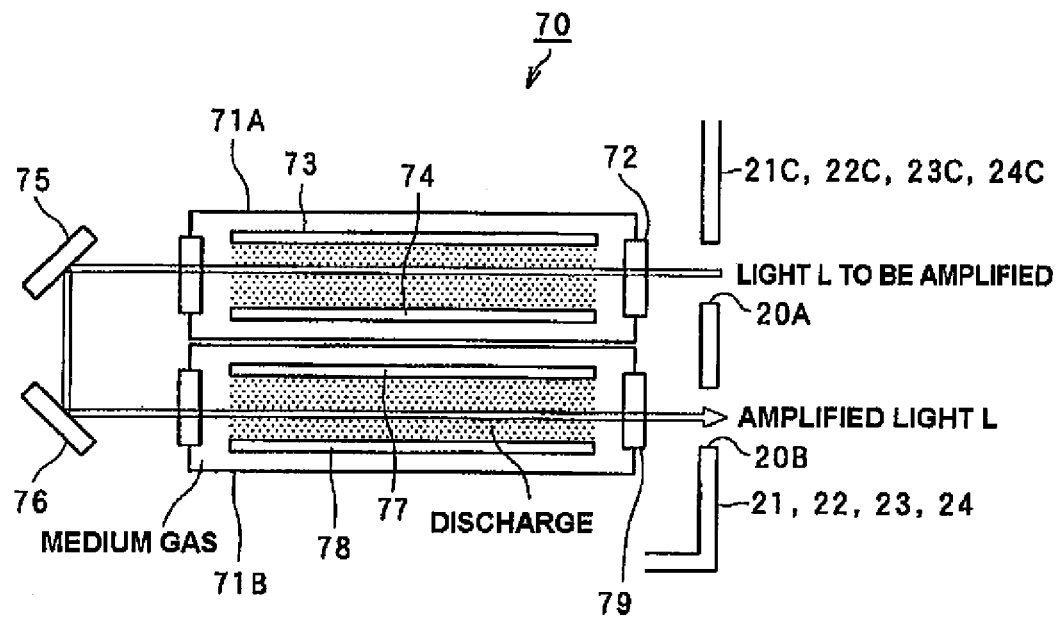
FIGS. 5A and 5B are diagrams showing other examples of inner configuration of the amplifier unit of the first example, respectively.
Figure 5B:
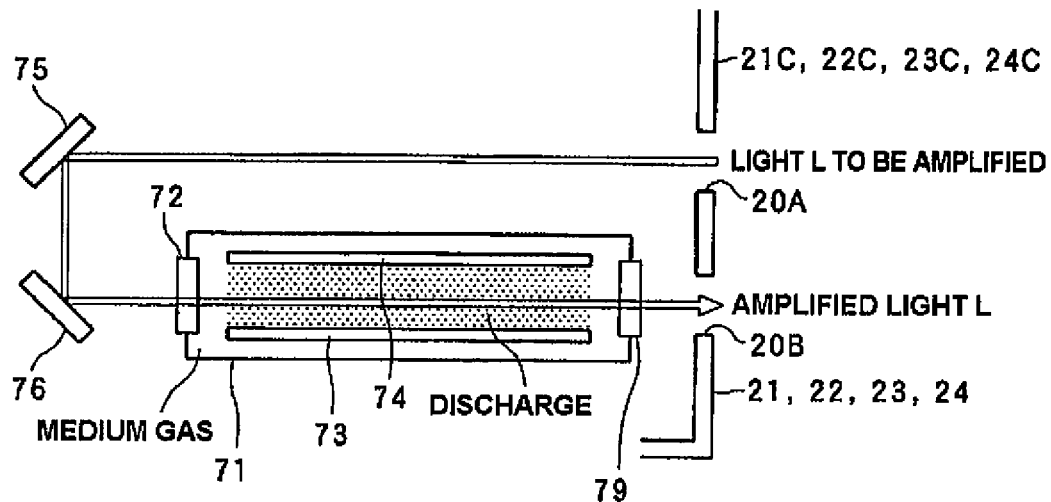

In FIG. 4B, although the amplifier 70 is formed by a single tube 71, the amplifier 70 may have a configuration in which the tube 71 is separated into two tubes 71A, 71B as shown in FIG. 5A. Additionally, although the amplifier 70 comprises two pairs of electrodes in FIG. 4B, the amplifier 70 may have a configuration in which the amplifier has only one pair of electrodes 73, 74 as shown in FIG. 5B. In FIG. 5B, by using the mirrors 75, 76, the light input from the input port 20A to be amplified is reflected to be guided to the tube 71 through the window 72 on the one side of the tube 71, and the amplified light is output from the output port 20B through a window 79 on the other side of the tube 71. With this configuration, the light can be input and output through the input port 20A and the output port 20B provided to the same surface 21C of the housing, as is the case with the amplifier 70 as shown in FIGS. 41B and 5A.

As shown in FIG. 6, the optical element module 30 has a configuration in which the group of optical elements 31 is arranged on the plate 32 formed with one-piece member. The group of optical elements 31 is arranged on a same surface 32A of the plate 32. The group of optical elements 31 comprises optical elements 31a, 31b, 31c . . . for shaping and transferring the laser light L through the optical path LR among the oscillator unit 11 and the amplifier units 21, 22, 23, 24. The group of optical elements 31 includes, for example, a divergence correction optical system 31a, a spatial filter 31b, collimator optical systems 31c, 31d, 31e, a beam expander 31g, an isolator 31h, and mirrors 311, 312, 313, 314, 315, 316, 317, 318, 319, 320, 321, 322, 323, 324, 325, 326. The isolator 31h is provided for blocking a light returned from a target and avoiding the self-excited oscillation.

As shown in FIG. 7, the optical element module 30 comprises a cover 33 that covers the plate 32 and the group of optical elements 31.

The cover 33 of the optical element module 30 is provided with a purge gas inlet 34 from which a purge gas such as N2 gas is introduced in the cover 33, and hatches 35, 36, 37 that are provided for maintenance and can be freely opened or closed. Furthermore, the cover 33 is provided with a pressure detection unit 38 for detecting pressure in the cover 33, a flow rate control unit 39 for controlling a flow rate of the gas in the cover 33, and a laser output port 30a through which the $CO_2$ laser light L is output. Note that the laser output port 30a is connected to an EUV light generation chamber, which is not shown, through a light introduction path 80.

As shown in FIG. 6, the oscillator unit 11 and the amplifier units 21, 22 are arranged such that each of the surfaces 11A, 21A, 22A having a wide area other than the surface 11C, 21C, 22C having the smallest area of the housing of each of the oscillator unit 11 and the two amplifier units 21, 22 is next to each other and faces each other. Additionally, the amplifier units 23, 24 are arranged such that each of the surfaces 23A, 24A having a wide area other than the surface 23C, 24C having the smallest area of the housing of each of the amplifier units 23, 24 is next to each other and faces each other.

Additionally, the oscillator unit 11, the amplifier units 21, 22, 23, 24, and the plate 32 are arranged such that the outgoing light from the output port 10B provided to the oscillator unit 11, and the incoming light input to and the outgoing light output from the input port 20A and the output port 20B provided to each of the amplifier units 21, 22, 23, 24 intersect with the plate 32 via holes 32a, 32b, 32c, 32d, 32e, 32f, 32g, 32h, 32i formed in the plate 32. In other words, the surface 11C having the output port 10B among the surfaces of the housing of the oscillator unit 11, the surfaces 21C, 22C, 23C, 24C each having the input port 20A and the output port 20B among the surfaces of the housing of each amplifier unit 21, 22, 23, 24, and a rear surface 32B of the plate 32, namely, the surface 32B on which the group of optical elements 31 is not installed, are arranged in parallel and face each other.

The housings of the oscillator unit 11 and the amplifier units 21, 22, whose adjoining wide surfaces 11A, 21A, 22A are made face each other, are layered in the vertical direction, while the housings of the amplifier units 23, 24, whose adjoining wide surfaces 23A, 24A are made face to each other, are layered in the vertical direction. In the first example, the amplifier unit 21 is layered on the amplifier unit 22, the oscillator unit 11 is layered on the amplifier unit 21, and the amplifier unit 24 is layered on the amplifier unit 23. Accordingly, the plate 32 is arranged vertically.

Next, operation performed in the laser device 1 having the configuration above will be described.

In the laser oscillator 60 of the oscillator unit 11, the laser light L is generated, and the generated laser light L is output to the outside through the output port 10B provided to the surface 11C of the housing of the oscillator unit 11. The laser light output from the output port 10B passes through the hole 32a from the rear surface 32B of the plate 32 of the optical element module 30, and is projected onto the mirror 311 provided to the front surface 32A of the plate 32. After being reflected by the mirror 311, the laser light L passes through the divergence correction optical system 31a, and is projected onto the mirror 312. After being reflected by the mirror 312, the laser light L is projected onto the mirror 313. After being reflected by the mirror 313, the laser light L passes through the spatial filter 31b and the collimator optical system 31c, and is projected onto the mirror 314. After being reflected by the mirror 314, the laser light L passes through the hole 32b from the front surface 32A of the plate 32 of the optical element module 30, is guided to the side of the rear surface 3213 of the plate 32, and is input into the input port 20A provided to the surface 21C of the housing of the amplifier unit 21.

In the amplifier 70 of the amplifier unit 21, the laser light L is amplified, and the amplified laser light L is output to the outside from the output port 20B provided to the surface 21C of the housing of the amplifier unit 21. The laser light L output from the output port 20B passes through the hole 32c from the rear surface 32B of the plate 32 of the optical element module 30, and is projected onto the mirror 315 provided to the front surface 32A of the plate 32. After being reflected by the mirror 315, the laser light L is projected onto the mirror 316. After being reflected by the mirror 316, the laser light L passes through the collimator optical system 31d, and is projected onto the mirror 317. After being reflected by the mirror 317, the laser light L is projected onto the mirror 318. After being reflected by the mirror 318, the laser light L passes through the hole 32d from the front surface 32A of the plate 32 of the optical element module 30, is guided to the side of the rear surface 32B of the plate 32, and is input to the input port 20A provided to the surface 22C of the housing of the amplifier unit 22.

In the amplifier 70 of the amplifier unit 22, the laser light L is amplified, and the amplified laser light L is output to the outside from the output port 20B provided to the surface 22C of the housing of the amplifier unit 22. The laser light L output from the output port 20B passes through the hole 32e from the rear surface 32B of the plate 32 of the optical element module 30, and is projected onto the mirror 319 provided to the front surface 32A of the plate 32. After being reflected by the mirror 319, the laser light L passes through the beam expander 31g, and is projected onto the mirror 320. After being reflected by the mirror 320, the laser light L passes through the hole 32f from the front surface 32A of the plate 32 of the optical element module 30, is guided to the side of the rear surface 32B of the plate 32, and is input into the input port 20A provided to the surface 23C of the housing of the amplifier unit 23.

In the amplifier 70 of the amplifier unit 23, the laser light L is amplified, and the amplified laser light L is output to the outside from the output port 20B provided to the surface 23C of the housing of the amplifier unit 23. The laser light L output from the output port 20B passes through the hole 32g from the rear surface 32B of the plate 32 of the optical element module 30, and is projected onto the mirror 321 provided to the front surface 32A of the plate 32. After being reflected by the mirror 321, the laser light L is projected onto the mirror 322. After being reflected by the mirror 322, the laser light L passes through the collimator optical system 31e, and is projected onto the mirror 323. After being reflected by the mirror 323, the laser light L is projected onto the mirror 324. After being reflected by the mirror 324, the laser light L passes through the hole 32h from the front surface 32A of the plate 32 of the optical element module 30, is guided to the side of the rear surface 3213 of the plate 32, and is input into the input port 20A provided to the surface 24C of the housing of the amplifier unit 24.

In the amplifier 70 of the amplifier unit 24, the laser light L is amplified, and the amplified laser light L is output to the outside from the output port 20B provided to the surface 24C of the housing of the amplifier unit 24. The laser light L output from the output port 20B passes through the hole 32i from the rear surface 32B of the plate 32 of the optical element module 30, and is projected onto the mirror 325 provided on the front surface 32A of the plate 32. After being reflected by the mirror 325, the laser light L is projected onto the mirror 326. After being reflected by the mirror 326, the laser light L passes through the isolator 31h. After passing through the isolator 31h, the laser light L is output to the outside of the cover 33 from the laser output port 30a of the cover 33. The laser light L passes from the output port 30a through the light introduction path 80, and is projected onto the target, such as tin Sn in an EUV light generation chamber, which is not shown. As described above, the EUV light is generated.

In the optical element module 30, a purge is performed.

In other words, if the optical path LR of the high output $CO_2$ laser on the plate 32 is exposed to the atmospheric air, the laser light is absorbed by the atmospheric air. This causes the disturbance effect of the laser light, which may poses instability of the laser output. In this example, from the purge gas inlet 34 provided to the cover 33 of the optical element module 30, a purge gas such as N2 gas is introduced in the cover 33 to purge the atmospheric air from the interior of the cover 33 with the purge gas. Additionally, the cover 33 is connected to the light introduction path 80 through the laser output port 30a, and the light introduction path 80 and the laser output port 30a have a substantially enclosed structure, as is the case with the cover 33. Thus, the light introduction path 80 and the laser output port 30a, which are paths for the high output light, are purged as well.

The gas pressure within the laser output port 30a and the light introduction path 80, both of which are connected to the cover 33, and the gas pressure in the cover 33 are detected with the pressure detection unit 38. The flow rate control unit 39 controls the gas flow rate within the laser output port 30a, the light introduction path 80, both of which are connected to the cover 33, and the cover 33. According to the first example, the gas purge can be centralizedly performed over the entire optical path LR of the laser through the purge gas inlet 34 of the cover 33. Thus, the optical path LR of the high output $CO_2$ laser can be prevented from being exposed to the atmospheric air. This makes it possible to minimize the disturbance effect of the laser light, thereby stabilizing the laser output.

Incidentally, if the group of optical elements 31 is exposed to the atmospheric air during the maintenance, the dust is more likely to be attached to the optical elements 31a, 31b, . . . . The dust attached to the optical elements 31a, 31b, . . . absorbs the laser light, which raises the temperature of the optical elements 31a, 31b, . . . . This may cause the damage of the optical elements 31a, 31b, . . . . For example, in a case of the transmission-type optical elements with ZnSe, absorption coefficient of ZnSe sharply increases when the ZnSe reaches the temperature of 330° C., which leads to further absorption of the laser light. This means that even the slight existence of dust leads to the absorption of the high output laser light, and raises the temperature to the melting point since the dust is a heat source. In the first example, the maintenance of the group of optical elements 31, such as alignment adjustment, is performed through the maintenance hatches 35, 36, 37 locally provided to the cover 32. This enables minimizing the possibility that the dust is attached to the group of optical elements 31 due to the exposure of the group of optical elements 31 to the atmospheric air. Note that, since handling the high output light during the maintenance is dangerous, the purge gas such as N2 gas, which is used for preventing the laser light disturbance caused by the atmospheric air, may be temporarily diluted with the atmospheric air. It is only necessary to perform the purge at the time when the high output light is passed.

Next, effect of the first example will be described.

In the first example, as shown in FIG. 6, the oscillator unit 11 and the amplifier units 21, 22 are arranged such that each of the surfaces 11A, 21A, 22A having a wide area other than the surface 10C, 21C, 22C having the smallest area of the housing of each of the oscillator unit 11 and the two amplifier units 21, 22 is next to each other and faces each other. Additionally, the amplifier units 23, 24 are arranged such that each of the surfaces 23A, 24A having a wide area other than the surface 23C, 24C having the smallest area of the housing of each of the amplifier units 23, 24 is next to each other and faces each other. Thus, as shown in FIG. 3, the area covered by the oscillator 11 and the amplifier units 21, 22, 23, 24 can be reduced as compared with the conventional art (FIG. 1).

Additionally, in the first example, the oscillator unit 11, the amplifier units 21, 22, 23, 24, and the plate 32 are arranged such that the outgoing light from the output port 10B provided to the oscillator unit 11, and the incoming and the outgoing lights passing through the input port 20A and the output port 20B provided to each of the amplifier units 21, 22, 23, 24 intersect with the plate 32 via holes 32a, 32b, 32c, 32d, 32e, 32f, 32g, 32h, 32i formed in the plate 32. Thus, as shown in FIG. 3, the area covered by the oscillator 11, the amplifier units 21, 22, 23, 24, and the group of optical elements 31 can be reduced as compared with the conventional art (FIG. 1).

Additionally, in the first example, the housings of the oscillator unit 11 and the amplifier units 21, 22, whose adjoining wide surfaces 11A, 21A, 22A are made face to each other, are layered in the vertical direction, while the housings of the amplifier units 23, 24, whose adjoining wide surfaces 23A, 24A are made face to each other, are layered in the vertical direction. In other words, in the first example, the amplifier unit 21 is layered on the amplifier unit 22, the oscillator unit 11 is layered on the amplifier unit 21, and the amplifier unit 24 is layered on the amplifier unit 23. Thus, as shown in FIG. 3, although the area covered by the oscillator unit 11, the amplifier units 21, 22, 23, 24 is expanded in the vertical direction, the expansion in the horizontal direction can be reduced as compared with the conventional art (FIG. 1).

Additionally, by sharing interlock circuit or other items as much as possible, the size of the power supplies 41, 42, 43, 44, 45 are made small.

As a result, as shown in FIG. 3, the footprint (occupied area) FP can be 30-40 m$^2$, and be greatly reduced as compared with the footprint FP (100 m$^2$) of the conventional art (FIG. 1). Therefore, in the first example, even if the laser device 1 is configured to have a number of amplifier units 21, 22, 23, 24, the footprint FP necessary for installing the laser device 1 on the floor in the semiconductor manufacturing lines and so on can be reduced.

Additionally, as shown in FIG. 6, the optical element module 30 has a configuration in which the group of optical elements 31 is arranged on the plate 32 formed with one-piece member. Thus, the length of the optical path LR becomes shorter than the conventional art (FIG. 1), and the group of optical elements 31 can be centralizedly arranged in one place on the plate 32. This enables the increase in the work efficiency during the maintenance of the group of optical elements 31, which leads to the decrease in operator's burden. Additionally, because of the shortened optical path LR, the group of optical elements is less likely to be affected by the vibration and so on. This enables the laser output to be stabilized in a long term. For example, once the alignment adjustment is performed for the optical elements, the adjusted alignment becomes less likely to be shifted, which leads to the long-term stable use of the optical elements.

Additionally, in the first example, the group of optical elements 31 is arranged on a same surface 32A of the plate 32. Thus, the operator can intensively perform the maintenance operations of the group of optical elements 31 on the same surface 32A of the plate 32. This enables the further improvement in the operability during the maintenance, and the further reduction in operator's burden.

Additionally, in the first example, the optical element module 30 is provided with the cover 33. Thus, by removing the cover 33 or opening the hatches 35, 36, 37, all the optical elements can be easily adjusted, which enables a reduction in the maintenance operations.

Note that in the first example, the laser oscillator 60 has a structure shown in FIG. 4A, and the amplifier 70 has a structure shown in FIGS. 4B, 5A, and 5B. However, each of those structures is only one example. Various structures may be possible for each of the laser oscillator 60 and the amplifier 70, provided that the arrangement of the surface 11C having the output port 10B among the surfaces of the housing of the oscillator unit 11, the surfaces 21C, 22C, 23C, 24C having the input port 20A and the output port 20B among the surfaces of the housing of the amplifier units 21, 22, 23, 24, the rear surface 32B of the plate 32, namely, the surface 32B in which the group of optical elements 31 is not arranged, are made in parallel and made face each other.

Additionally, in the first example, the description has been made on the assumption that the optical element module 30 is provided with the optical elements 31a, 31b, 31c, . . . shown in FIG. 6, and the laser light passes through each of the optical elements in the sequence shown in FIG. 6. However, this is only one example. And, it may be possible to optionally select the optical elements and the order of passing through the optical elements, on the basis of the quality of beam from the oscillator and the diameter of the amplifier.

Various types of modification can be implemented for the above-described first example. In the following examples, the configuration is the same as the first example unless otherwise specified.

Second Example

Figure 2:
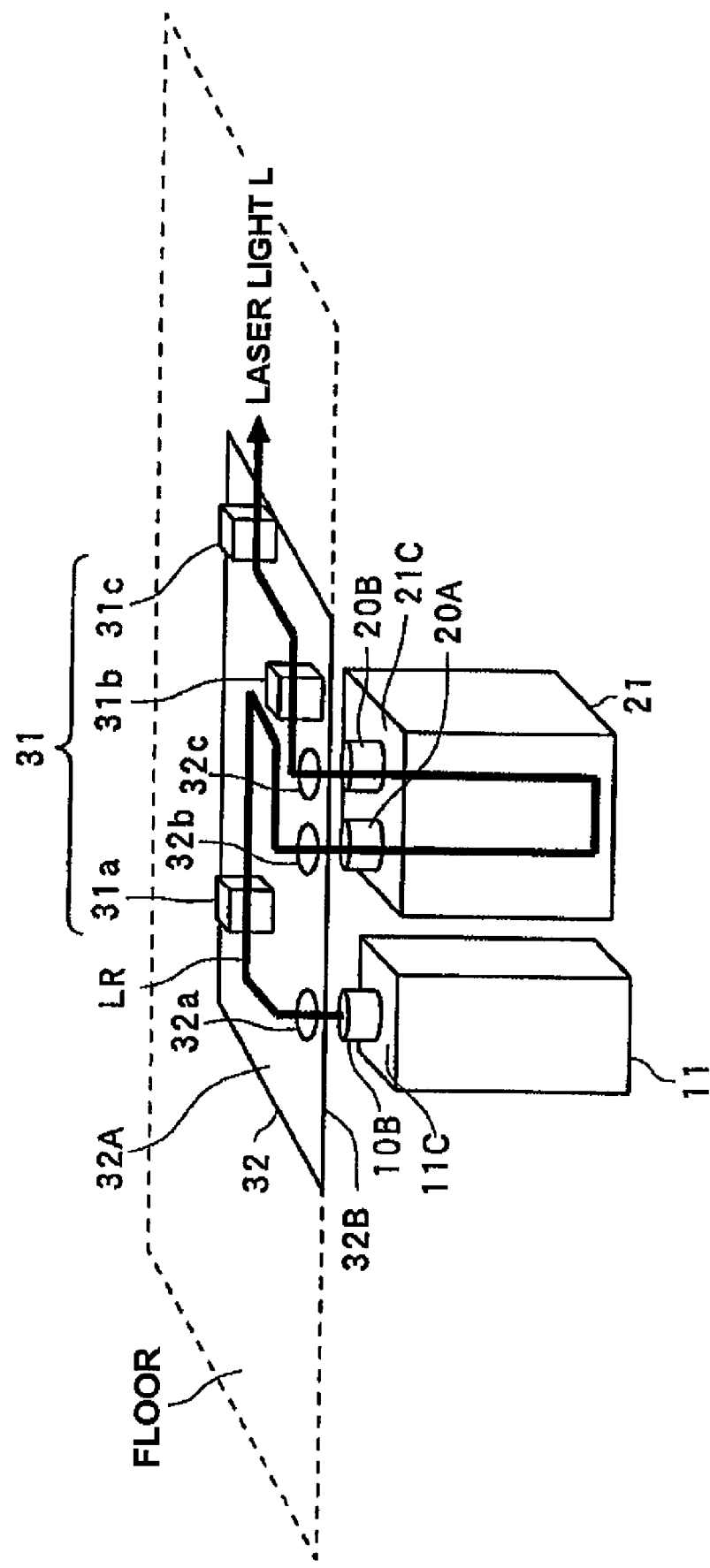
FIG. 2 is a perspective view showing a configuration of a second example.

FIG. 2 is a perspective view showing a configuration of a second example.

The housings of the oscillator unit 11 and the amplifier unit 21 are placed below the plate 32 of the optical element module 30. The oscillator unit 11, the amplifier unit 21, and the plate 32 are arranged such that the outgoing light from the output port 10B provided to the oscillator unit 11, and the incoming and the outgoing lights passing through the input port 20A and the output port 20B provided to the amplifier unit 21 intersect with the plate 32 via the holes 32a, 32b, 32c formed in the plate 32.

Thus, the area covered by the oscillator unit 11 and the amplifier 21 is confined within the floor area covered by the plate 32, whereby the footprint (occupied area) FP can be greatly reduced as compared with the conventional art (FIG. 1).

In FIG. 2, only the housings of the oscillator unit 11 and the amplifier unit 21 are placed below the plate 32 of the optical element module 30. However, it is only necessary that the housing of the oscillator unit, and the housing of at least one amplifier unit or each housing of at least two amplifier units are place below the plate 32.

For example, it may be possible to arranged the plate 32 on the floor, and place the oscillator unit 11 and amplifier units 21, 22, 23, 24 below the plate 32, while the relative position among the plate 32, the oscillator unit 11, amplifier units 21, 22, 23, 24 described in the first example remains the same as the relative position shown in FIG. 6.

Third Example

In the first example, the housings of the oscillator unit 11 and the amplifier units 21, 22 are layered in the vertical direction, while the housings of the amplifier units 23, 24 are layered in the vertical direction. Thus, at the time of maintenance of the oscillator unit 11 and the amplifier units 21, 22, 23, 24, the operator may not access the check/maintenance target because of being blocked by the other layered units.

Figure 8A:
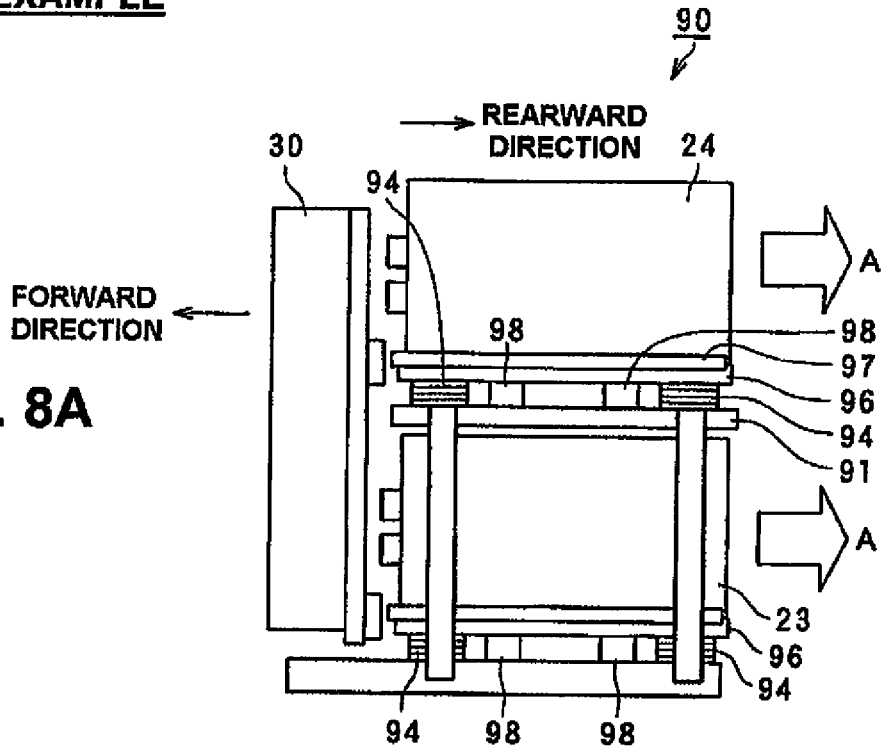
FIGS. 8A through 8C are diagrams for explaining a third example.
Figure 8B:
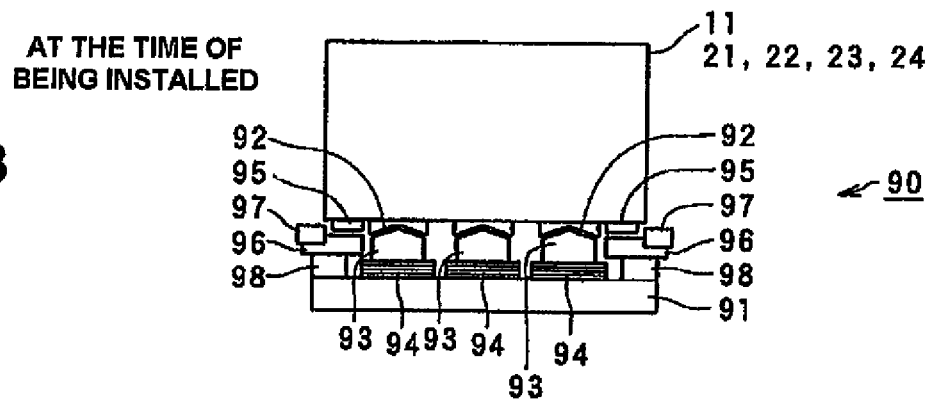
Figure 8C:
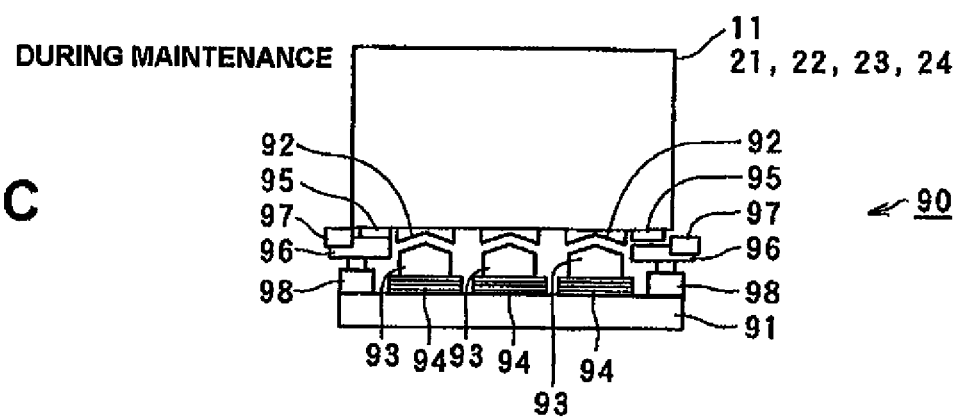

Thus, it may be possible to provide a maintenance mechanism 90 as shown in FIGS. 8A through 8C to make it possible for the oscillator unit 11 and the amplifier units 21, 22, 23, 24 to be freely drawn toward the rear direction of the optical element module 30, and to enable the operator to access the check or maintenance target.

FIG. 8A is a diagram illustrating the maintenance mechanism 90 as viewed from a side of the optical element module 30. FIG. 8B is a diagram illustrating the maintenance mechanism 90 as viewed from a rear side of the optical element module 30, showing a state where the oscillator unit 11 and the amplifier units 21, 22, 23, 24 are fixedly installed to a frame 91. FIG. 8C is a diagram illustrating the maintenance mechanism 90 as viewed from the rear side of the optical element module 30, showing a state where the oscillator unit 11 and the amplifier units 21, 22, 23, 24 are made drawable with respect to the frame 91.

As shown in FIGS. 8A to 8C, the maintenance mechanism 90 comprises: the frame 91 that independently supports the oscillator unit 11, and the amplifier units 21, 22, 23, 24; a positioning hole 92 formed on the undersurface of the oscillator unit 11, and the amplifier units 21, 22, 23, 24; a positioning pin 93 that is provided at a position opposing to the positioning hole 92 of the frame 91 and that fits with the positioning hole 92; an XYZ adjuster 94 for adjusting the 3-D position of the oscillator unit 11, and the amplifier units 21, 22, 23, 24 installed to frame 91; a roller 95 provided below the oscillator unit 11, and the amplifier units 21, 22, 23, 24; a rail 96 for slidingly moving the roller 95; a rail guide 97 for guiding the roller 95 disposed on the rail 96; and, a lift mechanism 98 for moving the rail 96 provided to the frame 91 in the vertical direction.

At the time when the laser light L is being generated, as shown in FIGS. 8A and 8B, the lift mechanism 98 does not perform the lift operation; the rail 96 and the roller 95 are spaced apart; and the positioning pin 93 is fitted with the positioning hole 92. Thus, the oscillator unit 11 and the amplifier units 21, 22, 23, 24 are fixedly installed to the frame 91. Additionally, with the adjustment by the XYZ adjuster 94, the oscillator unit 11 and the amplifier units 21, 22, 23, 24 are positioned with respect to the optical element module 30 within a given accuracy.

At the time of the maintenance, as shown in FIG. 8C, the maintenance mechanism 90 is activated; and, at least one of the oscillator unit 11, and the amplifier units 21, 22, 23, 24 is drawn. In other words, the lift mechanism 98 performs the lift operation; the rail 96 is lifted; the rail 96 and the roller 95 are contacted with each other; and, the positioning pin 93 are spaced apart from the positioning hole 92. As a result, guided by the rail guide 97 on the rail 95 through the roller 95, the oscillator unit 11 and the amplifier units 21, 22, 23, 24 are moved toward the rear direction A (FIG. 8A) of the optical element module 30. At this time, it may be possible to approach a bogie (not shown), etc. provided with a rail connectable to the rail 96, and move each unit onto the bogie through the connected rail. This makes it possible to easily access the check or maintenance target. By moving to the bogie, etc., the units can be exchanged easily.

Fourth Example

In the first example, the oscillator unit 11 and the amplifier units 21, 22, 23, 24 are arranged in the rear of the vertically arranged plate 32 of the optical element module 30. However, in a case of the layout according to the first example, there is a possibility that the check or maintenance target cannot be easily accessed when the maintenance operation is performed for the power supplies 41, 42, 43, 44, 45, etc.

Figure 9:
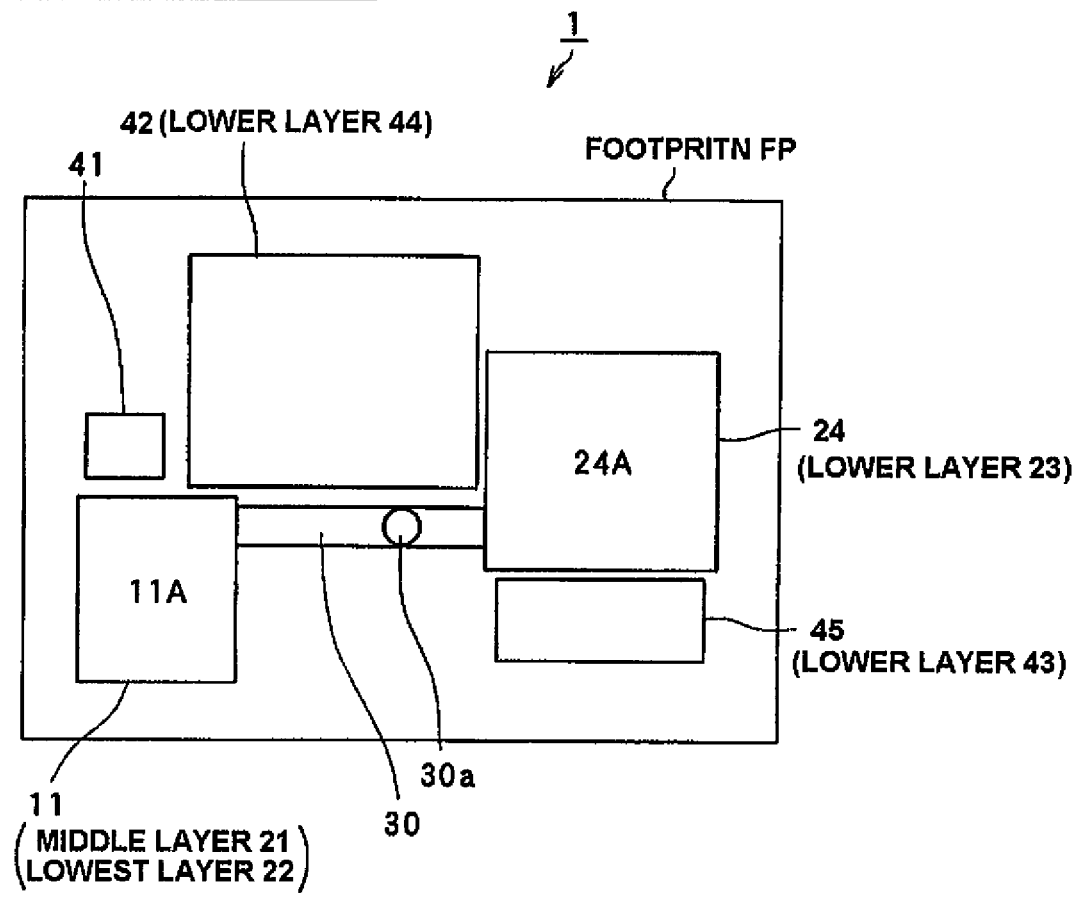
FIG. 9 is a top view of the laser device of a fourth example.
Figure 10:
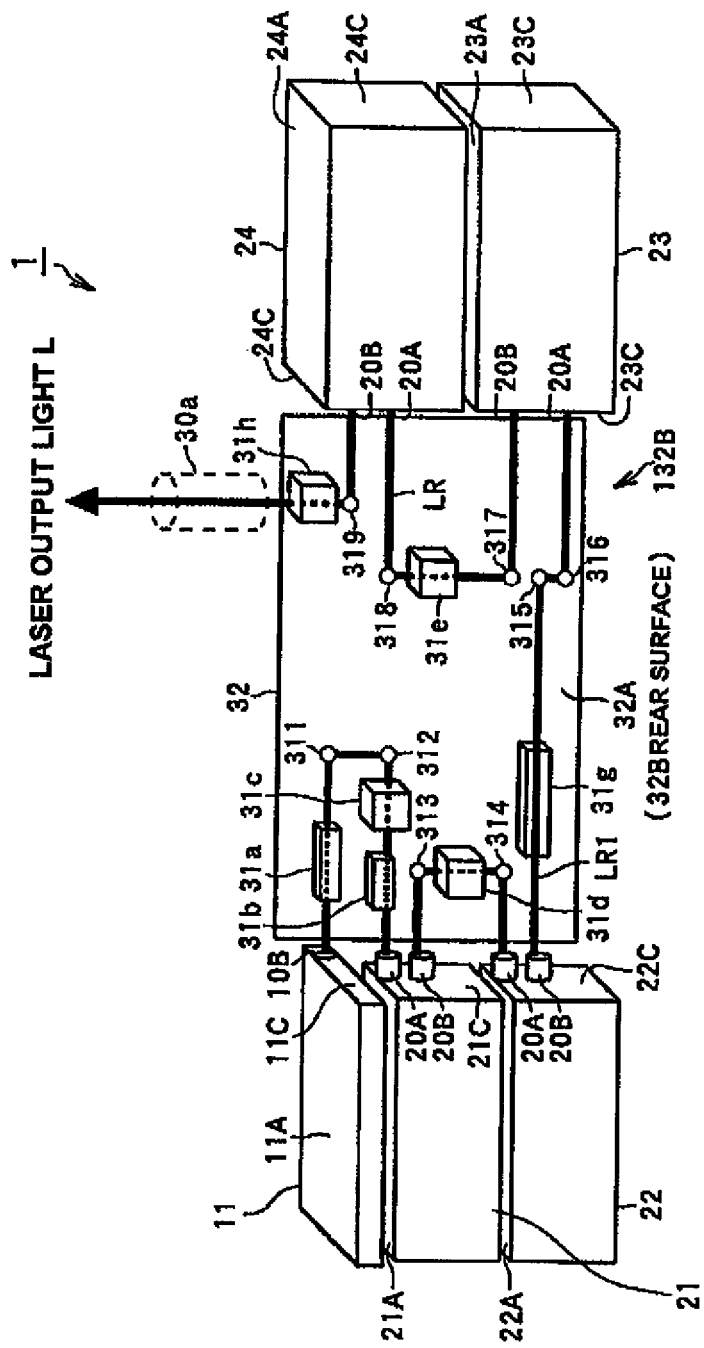
FIG. 10 is a perspective diagram illustrating the laser device of the fourth example as viewed from the front surface side.

Then, as shown in FIGS. 9 and 10, it may be possible to arrange the oscillator unit 11 and the amplifier units 21, 22, 23, 24 at the side of the vertically arranged plate 32 of the optical element module 30.

FIG. 9 is a diagram corresponding to FIG. 3 illustrating the first example, and is a top view of the laser device 1 of a fourth example. FIG. 10 is a diagram corresponding to FIG. 6 illustrating the first example, and is a perspective diagram illustrating the laser device 1 of the fourth example as viewed from the front surface side.

As shown in FIGS. 9 and 10 as is the case with the first example, the oscillator unit 11 and the amplifier units 21, 22 are arranged such that each of the surfaces 11A, 21A, 22A having a wide area other than the surface 11C, 21C, 22C having the smallest area of the housing of each of the oscillator unit 11 and the two amplifier units 21, 22 is next to each other and faces each other. Additionally, the amplifier units 23, 24 are arranged such that each of the surfaces 23A, 24A having a wide area other than the surface 23C, 24C having the smallest area of the housing of each of the amplifier units 23, 24 is next to each other and faces each other. Additionally, as is the case with the first example, the amplifier unit 21 is layered on the amplifier unit 22, the oscillator unit 11 is layered on the amplifier unit 21, and the amplifier unit 24 is layered on the amplifier unit 23.

However, unlike the first example, the oscillator unit 11 and the amplifier units 21, 22 are arranged at one side of the vertically arranged plate 32 of the optical element module 30, while the amplifier units 23, 24 are arranged at the other side of the vertically arranged plate 32. Additionally, the oscillator unit 11, the amplifier units 21, 22, 23, 24 and the plate 32 are arranged such that the optical path LR of the outgoing light from the output port 10B provided to the oscillator unit 11, and the incoming and the outgoing lights passing through the input port 20A and the output port 20B provided to each of the amplifier units 21, 22, 23, 24 is in parallel with the front surface 32A of the plate 32. Accordingly, the optical path LR on the plate 32 is different from the optical path LR on the plate 32 in the case of the first example (FIG. 6), and hence the arrangement of the optical elements 31a, 31b, 31e, . . . on the plate 32 is different from the arrangement in the first example.

As a result, a space is available at the side of the rear surface 32B of the vertically arranged plate 32 of the optical element module 30. Thus, it is desirable to place, for example, the power supplies 44, 45 to this space (see FIG. 9).

Therefore, even in a case of the layout in the fourth example, the footprint FP similar to the first example can be achieved, and hence the occupied space on the floor area can be greatly reduced as compared with the conventional art (FIG. 1).

Note that, in the fourth example, it may be possible to dispose the surface of the plate 32 in parallel with the floor, and arrange the oscillator unit 11 and the amplifier units 21, 22, 23, 24 at the side of the plate 32, while the relative position of the plate 32, the oscillator 11, and the amplifier units 21, 22, 23, 24 remains the same as the relative position shown in FIG. 10.

Fifth Example

In the examples above, a description has been made on the assumption that the group of optical elements 31 is arranged on the same surface 32A of the plate 32. However, it may be possible to separately arrange the group of optical elements 31 on different surfaces of the plate 32, provided that the optical element module 30 has the configuration in which the group of optical elements 31 is arranged on the plate 32 formed with one-piece member.

Figure 11A:
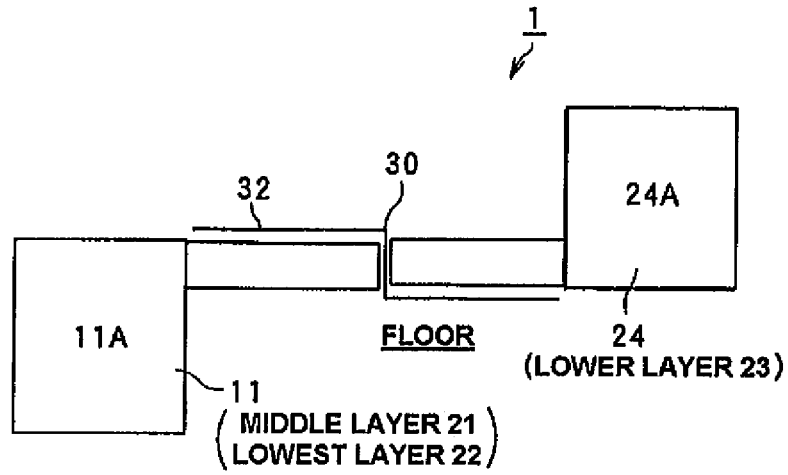
FIGS. 11A and 11B are configuration diagrams of the laser device of a fifth example.
Figure 11B:
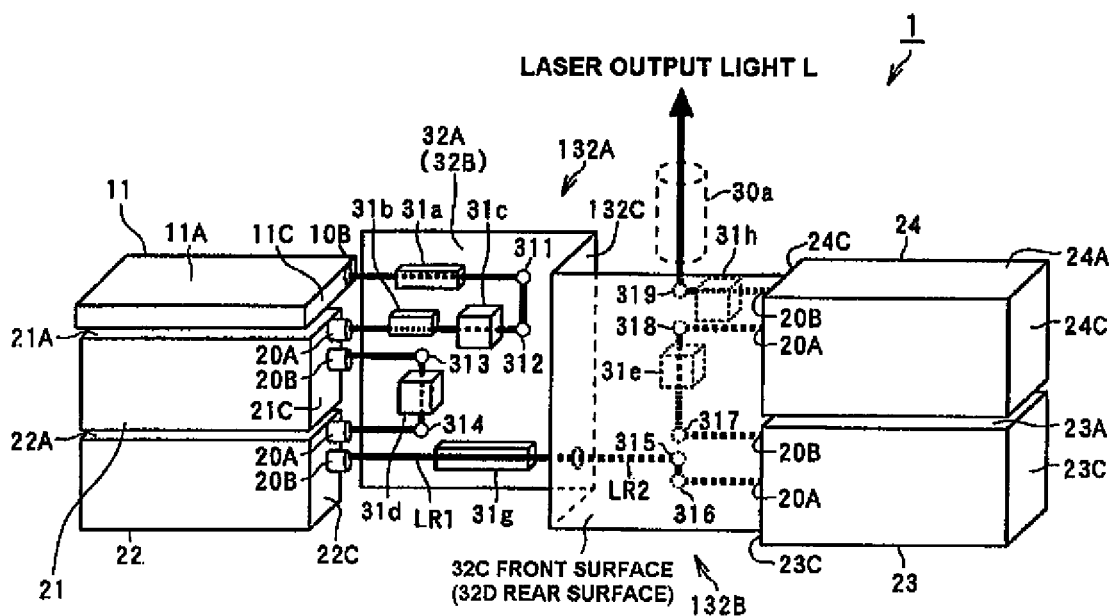

FIGS. 11A and 11B are configuration diagrams of the laser device 1 of a fifth example. FIG. 11A is a top view of the laser device 1, and FIG. 11B is a perspective view illustrating the laser device 1 as viewed from the front surface side.

As shown in FIG. 11, as is the case with the first and the fourth examples, the oscillator unit 11 and the amplifier units 21, 22 are arranged such that each of the surfaces 11A, 21A, 22A having a wide area other than the surface 11C, 21C, 22C having the smallest area of the housing of each of the oscillator unit 11 and the two amplifier units 21, 22 is next to each other and faces each other. Additionally, the amplifier units 23, 24 are arranged such that each of the surfaces 23A, 24A having a wide area other than the surface 23C, 24C having the smallest area of the housing of each of the amplifier units 23, 24 is next to each other and face each other.

Additionally, as is the case with the first and the fourth examples, the amplifier unit 21 is layered on the amplifier unit 22; the oscillator unit 11 is layered on the amplifier unit 21; and, the amplifier unit 24 is layered on the amplifier unit 23.

Additionally, as is the case with the fourth example, the oscillator unit 11 and the amplifier units 21, 22 are arranged at one side of the vertically arranged plate 32 of the optical element module 30, while the amplifier units 23, 24 are arranged at the other side of the vertically arranged plate 32.

However, the plate 32 in the fifth example is formed in a stepped shape with one-piece member. The plate 32 comprises a first optical element arrangement plate section 132A, a second optical element arrangement plate section 132B that has a step with respect to the first optical element arrangement plate section 132A, and a step portion 132C where the first optical element arrangement plate section 132A and the second optical element arrangement plate section 132B are connected. The first optical element arrangement plate section 132A has a first front surface 32A on which part of the group of optical elements 31 are arranged, and a first rear surface 32B that is a back surface of the first front surface 32A. The second optical element arrangement plate section 132B has a second front surface 32C facing forward as is the case with the first front surface 32A, and a second rear surface 32D that is a back surface of the second front surface 32C and on which the rest of the group of optical elements 31 is arranged.

The oscillator unit 11, the amplifier units 21, 22, and the plate 32 are arranged such that an optical path LR1 of the outgoing light from the output port 10B provided to the oscillator unit 11 and the incoming and the outgoing lights passing through the input port 20A and the output port 20B provided to each of the amplifier units 21, 22 is in parallel with the first front surface 32A of the plate 32. Additionally, the amplifier units 23, 24 and the plate 32 are arranged such that an optical path LR2 of the incoming and the outgoing lights passing through the input port 20A and the output port 20B of the amplifier units 23, 24 is in parallel with the second rear surface 32D of the plate 32. The step portion 132C has a hole 32j for connecting the optical path LR1 on the first front surface 32A with the optical path LR2 on the second rear surface 32D.

Note that, in the fifth example, it may be possible to dispose the surface of the plate 32 in parallel with the floor, and arrange the oscillator unit 11 and the amplifier units 21, 22, 23, 24 at the side of the plate 32, while the relative position of the plate 32, the oscillator 11, and the amplifier units 21, 22, 23, 24 remains the same as the relative position shown in FIG. 11.

Sixth Example

In the fifth example above, the oscillator unit 11 and the amplifier units 21, 22, 23, 24 are arranged at the side of the plate 32 of the optical element module 30. However, it may be possible to arrange the oscillator unit 11 and the amplifier units 21, 22, 23, 24 so as to be opposite to the surface of the plate 32 of the optical element module 30.

Figure 12A:
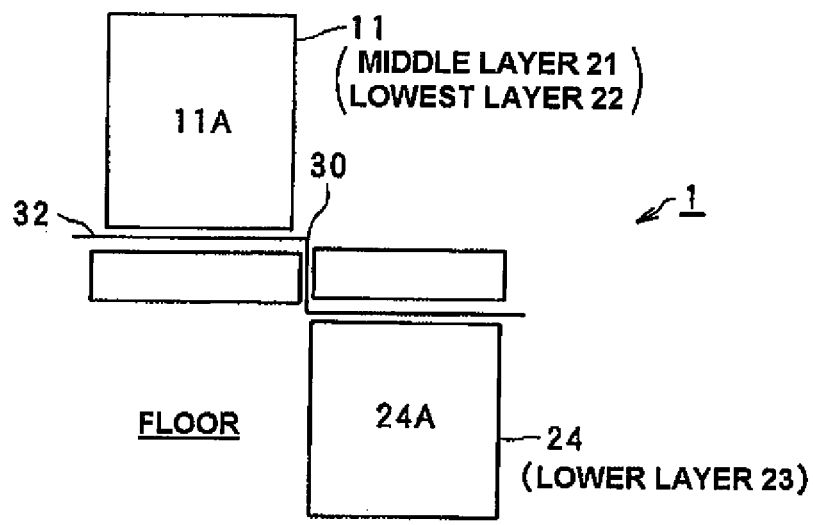
FIG. 12A is a top view of the laser device.
Figure 12B:
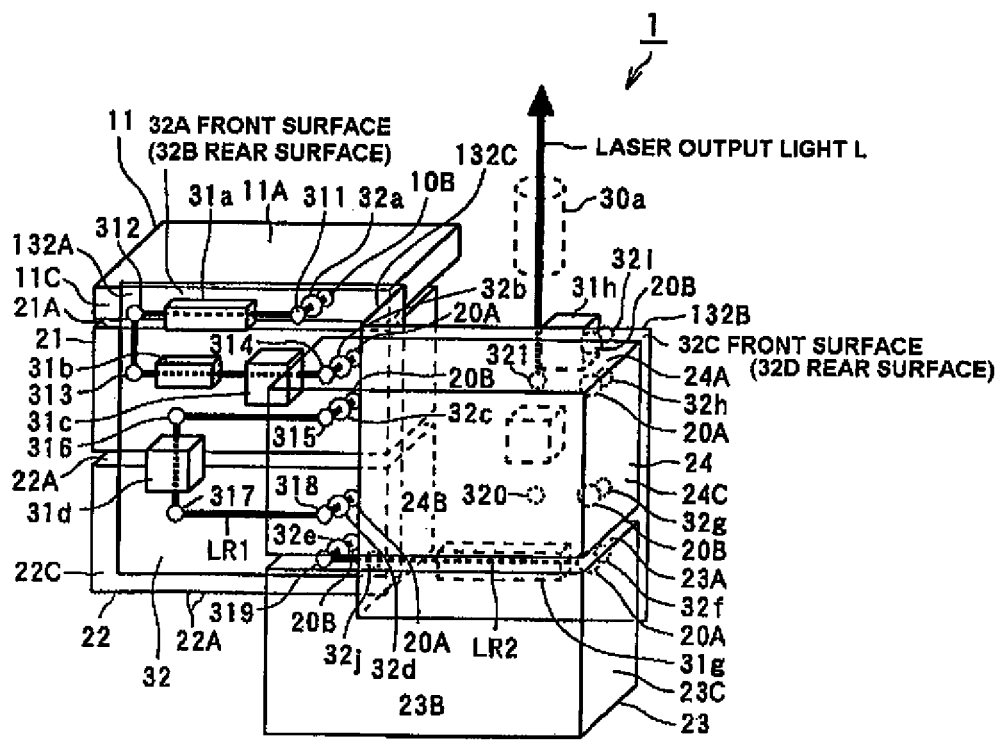
FIG. 12B is a perspective view illustrating the laser device as viewed from a front surface side.

FIGS. 12A and 12B are configuration diagrams of the laser device 1 of a sixth example. FIG. 12A is a top view of the laser device 1, and FIG. 12B is a perspective view illustrating the laser device 1 as viewed from a front surface side.

As shown in FIGS. 12A and 12B, as is the case with the first, the fourth, and the fifth examples, the oscillator unit 11 and the amplifier units 21, 22 are arranged such that each of the surfaces 11A, 21A, 22A having a wide area other than the surface 11C, 21C, 22C having the smallest area of the housing of each of the oscillator unit 11 and the two amplifier units 21, 22 is next to each other and faces each other. Additionally, the amplifier units 23, 24 are arranged such that each of the surfaces 23A, 24A having a wide area other than the surface 23C, 24C having the smallest area of the housing of each of the amplifier units 23, 24 is next to each other and faces each other. Note that, in the sixth example, the output port 10B of the oscillator unit 11, and the input port 20A and the output port 20B of each of the amplifier units 21, 22, 23, 24 are provided to the surfaces 11B, 21B, 22B, 23B, 24B having a wider area than the surfaces 11C, 21C, 22C, 23C, 24C having the smallest area, respectively.

Additionally, as is the case with the first, the fourth, and the fifth examples, the amplifier unit 21 is layered on the amplifier unit 22; the oscillator unit 11 is layered on the amplifier unit 21; and, the amplifier unit 24 is layered on the amplifier unit 23.

As is the case with the fifth example, the plate 32 in the sixth example is formed in a stepped shape with one-piece member.

The oscillator unit 11, the amplifier unit 21, 22, and the plate 32 are arranged such that the outgoing light from the output port 10B provided to the oscillator unit 11, and the incoming and the outgoing lights passing through the input port 20A and the output port 2013 provided to each of the amplifier units 21, 22 intersect with the plate 32 via the holes 32a, 32b, 32c, 32d, 32e formed in the plate 32. In other words, the surface 11B having the output port 10B among the surfaces of the housing of the oscillator unit 11, the surfaces 21B, 22B each having the input port 20A and the output port 20B among the surfaces of the housing of each of the oscillator amplifiers 21, 22, and the first rear surface 32B of the plate 32, namely, the surface 32B on which the group of optical elements 31 is not installed, are arranged in parallel and made face each other. Additionally, the amplifier units 23, 24, the plate 32 are arranged such that the incoming and the outgoing lights passing through the input port 20A and the output port 20B of each of the amplifier units 23, 24 intersect with the plate 32 via the holes 32f, 32g, 32h, 32i formed in the second optical element arrangement plate section 132B of the plate 32. In other words, the surfaces 23B, 24B each having the input port 20A and the output port 20B among the surfaces of the housing of each of the amplifier units 23, 24, and the second front surface 32C of the plate 32, namely, the surface 32C on which the group of optical elements 31 is not installed, are arranged in parallel and made face each other.

The step portion 132C has the hole 32j for connecting the optical path LR1 on the first front surface 32A with the optical path LR2 on the second rear surface 32D.

Note that, in the sixth example, it may be possible to arrange the oscillator unit 11 and the amplifier units 21, 22, 23, 24 such that the surface of the plate 32 is in parallel with the floor and the surface of the plate 32 faces the floor, while the relative position of the plate 32, the oscillator 11, and the amplifier units 21, 22, 23, 24 remains the same as the relative position shown in FIG. 11.

What is claimed is:

1. A laser device comprising:
   a one-piece plate having a first surface, a second surface opposite to the first surface, and holes for an optical path of a laser light;
   an oscillator unit being disposed at the first surface of the plate, and comprising a laser oscillator for generating the laser light and a rectangular-solid-shaped housing for the oscillator;
   an amplifier unit being disposed at the first surface of the plate, and comprising an amplifier for amplifying the laser light from the oscillator and a rectangular-solid-shaped housing for the amplifier; and
   an optical element module being disposed on the second surface of the plate, and comprising a first group of optical elements and a second group of optical elements,
   the first group of optical elements comprising one or more optical elements for receiving the laser light from the oscillator unit or the amplified laser light from the amplifier unit through a hole, and guiding the laser light or the amplified laser light to the amplifier unit through a hole, and
   the second group of optical elements comprising one or more optical elements for receiving the amplified laser light from the amplifier unit through a hole, and guiding the amplified laser light as a laser output.

2. The laser device according to claim 1, wherein the optical element module comprises a cover that covers the plate and the first and second groups of optical elements.

3. The laser device according to claim 2, wherein the cover of the optical element module includes at least one of a purge gas inlet for introducing a purge gas, and a hatch for maintenance.

4. The laser device according to claim 1, wherein
the housings of the oscillator unit and the amplifier unit are located next to each other,
the housing of the oscillator unit has a first large area surface, and the housing of the amplifier unit has a second large area surface facing the first large area surface.

5. The laser device according to claim 1, wherein
when the amplifier unit comprises a first amplifier and a first housing for the first amplifier, and a second amplifier and a second housing for the second amplifier,
the first and second housings are located next to each other, and
the first housing has a first large area surface, and the second housing has a second large area surface facing the first large area surface.

6. The laser device according to claim 1, wherein the plate is separated from, independent of, and not in a part of, the housing of the oscillator and the housing of the amplifier.

7. The laser device according to claim 6, wherein:
the plate is vertically arranged; and
the oscillator unit and the amplifier unit are vertically layered.

8. The laser device according to claim 6, wherein:
the plate is vertically arranged; and
when the amplifier unit comprises a first amplifier and a second amplifier, the first and second amplifiers are vertically layered.

9. The laser device according to claim 6, wherein the first and second groups of the optical elements are disposed on the same second surface.

10. The laser device according to claim 6, wherein:
the plate is vertically arranged; and
the oscillator unit and the amplifier unit are vertically stacked along the first surface of the plate.

11. The laser device according to claim 10, wherein the amplifier unit includes a first amplifier and a second amplifier stacked on the first amplifier.

* * * * *